United States Patent
Hatamian

(10) Patent No.: US 6,563,333 B2
(45) Date of Patent: May 13, 2003

(54) DYNAMIC REGISTER WITH IDDQ TESTING CAPABILITY

(75) Inventor: Mehdi Hatamian, Mission Viejo, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/145,919

(22) Filed: May 15, 2002

(65) Prior Publication Data

US 2002/0163353 A1 Nov. 7, 2002

Related U.S. Application Data

(63) Continuation of application No. 09/439,120, filed on Nov. 12, 1999, now Pat. No. 6,411,117.
(60) Provisional application No. 60/108,647, filed on Nov. 16, 1998, provisional application No. 60/108,319, filed on Nov. 13, 1998, and provisional application No. 60/130,616, filed on Apr. 22, 1999.

(51) Int. Cl.[7] .............................................. G01R 31/26
(52) U.S. Cl. ....................................... 324/765; 324/769
(58) Field of Search ................................. 324/765, 768, 324/769, 158.1; 326/21, 93, 113, 119; 327/202, 203, 211, 396, 401; 365/189.12, 222, 239, 240

(56) References Cited

U.S. PATENT DOCUMENTS

| | | | | |
|---|---|---|---|---|
| 5,528,177 A | * | 6/1996 | Sridhar et al. | 326/113 |
| 5,612,632 A | * | 3/1997 | Mahant-Shetti et al. | 326/46 |
| 5,654,658 A | * | 8/1997 | Kubota et al. | 327/202 |
| 5,778,037 A | * | 7/1998 | Wuidart | 377/26 |
| 6,134,688 A | * | 10/2000 | Sachdev | 327/396 |
| 6,212,119 B1 | * | 4/2001 | Hatamian | 365/189.12 |
| 6,411,117 B1 | * | 6/2002 | Hatamian | 324/765 |

* cited by examiner

Primary Examiner—Kamand Cuneo
Assistant Examiner—Minh N. Tang
(74) Attorney, Agent, or Firm—McAndrews, Held & Malloy, Ltd.

(57) ABSTRACT

The present invention is a method and a system for controlling a voltage at a node in a circuit such that the node is prevented from having an unknown floating voltage during a steady state of a clock signal. The circuit includes a transmission gate which has input and output terminals, and operates in response to a clock signal. The node is located proximal to the output terminal of the transmission gate. The method includes the operations of driving the node with an input signal when the transmission gate is open during a first steady state of the clock signal and pulling the node to a fixed voltage when the transmission gate is closed during a second steady state of the clock signal.

32 Claims, 5 Drawing Sheets

DYNAMIC REGISTER WITH IDDQ TESTING CAPABILITY

CROSS-REFERENCE TO RELATED APPLICATIONS

This patent application is a continuation of U.S. patent application Ser. No. 09/439,120, filed Nov. 12, 1999, (now U.S. Pat. No. 6,411,117) entitled "Dynamic Register with IDDQ Testing Capability," which claims priority on the basis of the following provisional applications: Ser. No. 60/108,647, entitled "Dynamic Register with IDDQ Testing Capability," filed Nov. 16, 1998; Ser. No. 60/108,319, entitled "Gigabit Ethernet Transceiver," filed Nov. 13, 1998; Ser. No. 60/130,616, entitled "Multi-pair Gigabit Ethernet Transceiver," filed Apr. 22, 1999.

The present application is related to the following co-pending applications filed on Nov. 9, 1999, commonly owned by the assignee of the present application, the contents of each of which are herein incorporated by reference: Ser. No. 09/437,722, entitled "Efficient FIR Filter for High-speed Communication," and Ser. No. 09/437,719, entitled "Multi-pair Gigabit Ethernet Transceiver."

BACKGROUND OF THE INVENTION

1. Field of the Invention

The present invention relates generally to methods and systems for controlling a voltage at a node in a circuit such that the node is prevented from having an unknown floating voltage. More particularly, the invention relates to a method and a system for controlling nodes susceptible to floating voltages in a dynamic register included in a high speed communication integrated circuit while the integrated circuit is undergoing IDDQ testing for detection of circuit faults.

2. Background of Related Art

Local Area Networks (LAN) provides network connectivity for personal computers, workstations and servers. Ethernet, in its original 10BASE-T form, remains the dominant network technology for LANs. However, among the high speed LAN technologies available today, Fast Ethernet, or 100 BASE-T, has become the leading choice. Fast Ethernet technology provides a smooth, non-disruptive evolution from the 10 megabits per second (Mbps) performance of the 10BASE-T to the 100 Mbps performance of the 100BASE-T. The growing use of 100BASE-T connections to servers and desktops is creating a definite need for an even higher speed network technology at the backbone and server level.

The most appropriate solution to this need, now in development, is Gigabit Ethernet. Gigabit Ethernet will provide 1 gigabit per second (Gbps) bandwidth with the simplicity of Ethernet at lower cost than other technologies of comparable speed, and will offer a smooth upgrade path for current Ethernet installations.

In a Gigabit Ethernet communication system that conforms to the 1000 BASE-T standard, gigabit transceivers are connected via Category 5 twisted pairs of copper cables. Cable responses vary drastically among different cables. Thus, the computations, and hence power consumption, required to compensate for noise (such as echo, near-end crosstalk, far-end crosstalk) will vary widely depending on the particular cable that is used.

In integrated circuit technology, power consumption is generally recognized as being a function of the switching (clock) speed of transistor elements making up the circuitry, as well as the number of component elements operating within a given time period. The more transistor elements operating at one time, and the higher the operational speed of the component circuitry, the higher the relative degree of power consumption for that circuit. This is particularly relevant in the case of Gigabit Ethernet, since all computational circuits are clocked at 125 Mhz (corresponding to 250 Mbps per twisted pair of cable), and the processing requirements of such circuits require rather large blocks of computational circuitry, particularly in the filter elements. Power consumption figures in the range of from about 4.5 Watts to about 6.0 Watts are not unreasonable when the speed and complexity of modern gigabit communication circuitry is considered.

A Gigabit Ethernet transceiver includes a larger number of adaptive filters, which in turn require a large number of registers. Dynamic registers are preferred over static registers due to their low power consumption and faster operating speed. Thus, the requirements of small layout, low power consumption, and high operating speed of the Gigabit Ethernet transceiver necessitate the use of dynamic registers instead of static registers in most of the adaptive filters included in the Gigabit Ethernet transceiver. However, the use of dynamic registers poses a problem in IDDQ testing of the transceiver chip.

IDDQ testing, where IDDQ is the IEEE symbol for the quiescent current in CMOS integrated circuits, is a cost-effective test strategy for detecting faults in digital CMOS integrated circuits. IDDQ testing is ideal for static CMOS integrated circuits which draw extremely low leakage current IDD when no transistors are switching. This non-switching state is known as the quiescent state. Any defects in CMOS integrated circuits that cause a higher current than the assumed threshold value of IDD can be detected by this testing. When an integrated circuit includes a dynamic CMOS register, IDDQ testing becomes unreliable because floating nodes in the dynamic register may cause a substantial amount of power supply current to be dissipated in the dynamic register during the quiescent state. It is not possible to determine whether a large amount of power supply current drawn by the circuit was caused by a defect in the circuit or by floating nodes. Thus, floating nodes render the IDDQ test unreliable.

Thus, there is a need for a method and a system for controlling voltages at nodes that may become floating nodes in a dynamic register included in an integrated circuit while the integrated circuit is undergoing an IDDQ test.

SUMMARY OF THE INVENTION

The present invention is a method and a system for controlling a voltage at a node in a circuit such that the node is prevented from having an unknown floating voltage during a steady state of a clock signal. The circuit includes a transmission gate which has input and output terminals, and operates in response to a clock signal. The node is located proximal to the output terminal of the transmission gate. The method includes the operations of driving the node with an input signal when the transmission gate is open during a first steady state of the clock signal and pulling the node to a fixed voltage when the transmission gate is closed during a second steady state of the clock signal.

BRIEF DESCRIPTION OF THE DRAWINGS

These and other features, aspects and advantages of the present invention will be more fully understood when considered with respect to the following detailed description, appended claims and accompanying drawings, wherein:

DETAILED DESCRIPTION OF THE INVENTION

The present invention is a method and a system for preventing a node in a circuit from having an unknown floating voltage during a steady state of a clock signal. The system includes a control circuit to determine the voltage at the node. The node is either driven by an input signal or is pulled to a fixed voltage. As applied to a dynamic register, the method is to prevent a substantial amount of power supply current from being dissipated in the dynamic register during a steady state of the clock signal.

In one application of the present invention, the circuit is a dynamic register which includes a CMOS type transmission gate and an inverter disposed in series.

Dynamic registers are used in most of adaptive filters that are included in a Gigabit Ethernet transceiver of a communication system. For ease of explanation, the present invention will be described in detail as applied to this exemplary application. However, this is not to be construed as a limitation of the present invention.

Figure 1:
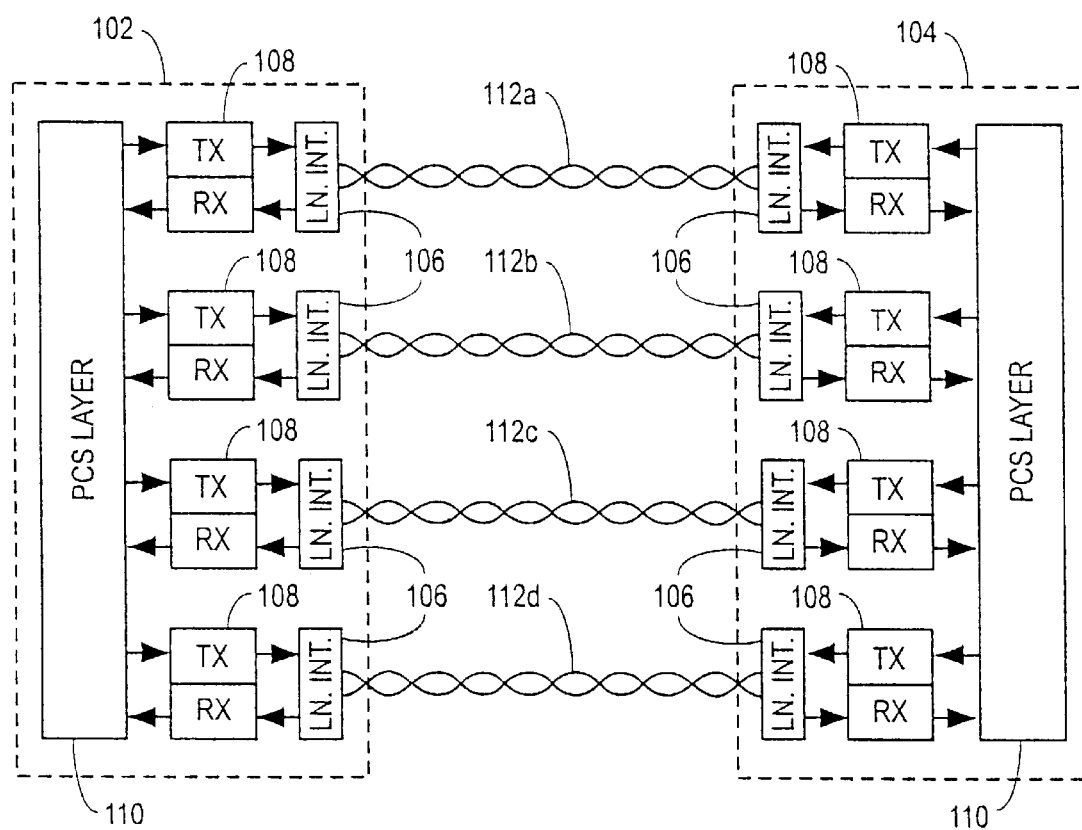
FIG. 1 is a simplified block diagram of a high-speed communication system including two gigabit transceivers configured to communicate over multiple twisted pair wiring channels.

In order to appreciate the advantages of the present invention, it will be beneficial to describe the invention in the context of an exemplary bidirectional communication device, such as an Ethernet transceiver. The particular exemplary implementation chosen is depicted in FIG. 1, which is a simplified block diagram of a multi-pair communication system operating in conformance with the IEEE 802.3ab standard (also termed 1000BASE-T) for 1 gigabit (Gb/s) Ethernet full-duplex communication over four twisted pairs of Category-5 copper wires. The communication system illustrated in FIG. 1 is represented as a point-to-point system, in order to simplify the explanation, and includes two main transceiver blocks 102 and 104, coupled together via four twisted-pair cables 112a, b, c and d. Each of the wire pairs 112a, b, c, d is coupled to each of the transceiver blocks 102, 104 through a respective one of four line interface circuits 106. Each of the wire pairs 112a, b, c, d facilitates communication of information between corresponding pairs of four pairs of transmitter/receiver circuits (constituent transceivers) 108. Each of the constituent transceivers 108 is coupled between a respective line interface circuit 106 and a Physical Coding Sublayer (PCS) block 110. At each of the transceiver blocks 102 and 104, the four constituent transceivers 108 are capable of operating simultaneously at 250 megabits of information data per second (Mb/s) each, and are coupled to the corresponding remote constituent transceivers through respective line interface circuits to facilitate full-duplex bidirectional operation. Thus, 1 Gb/s communication throughput of each of the transceiver blocks 102 and 104 is achieved by using four 250 Mb/s (125 Mbaud at 2 information data bits per symbol) constituent transceivers 108 for each of the transceiver blocks 102; 104 and four pairs of twisted copper cables to connect the two transceiver blocks 102, 104 together.

The exemplary communication system of FIG. 1 has a superficial resemblance to a 100BASE-T4 system, but is configured to operate at ten times the bit rate. As such, it should be understood that certain system performance characteristics, such as sampling rates and the like, will be consequently higher and cause a greater degree of power consumption. Also, at gigabit data rates over potentially noisy channels, a proportionately greater degree of signal processing is required in many instances to insure an adequate degree of signal fidelity and quality.

Figure 2:
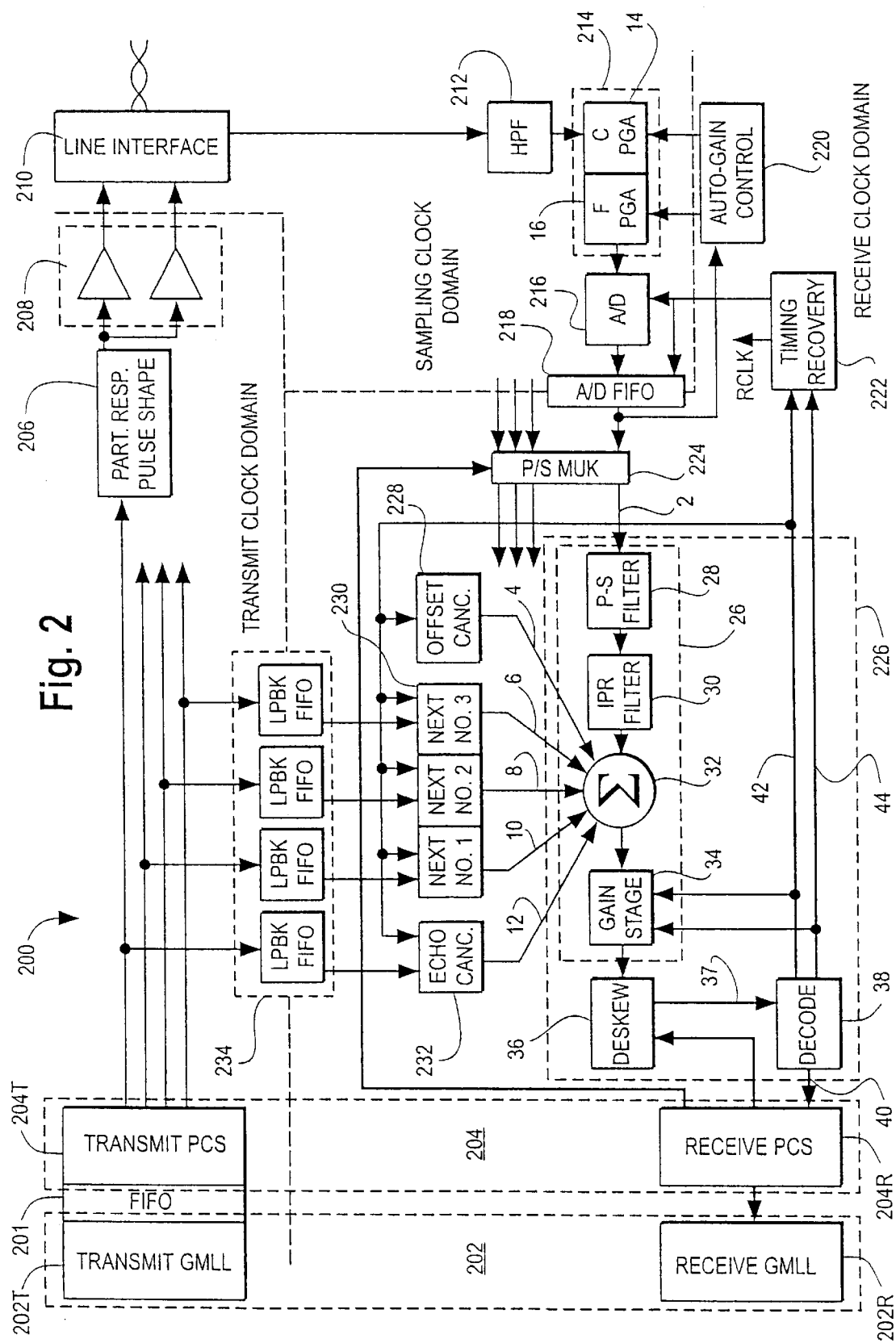
FIG. 2 is a block diagram of the gigabit transceiver.

FIG. 2 is a simplified block diagram of the functional architecture and internal construction of an exemplary transceiver block, indicated generally at 200, such as transceiver 102 of FIG. 1. Since the illustrative transceiver application relates to gigabit Ethernet transmission, the transceiver will be refered to as the "gigabit transceiver". For ease of illustration and description, FIG. 2 shows only one of the four 250 Mb/s constituent transceivers which are operating simultaneously (termed herein 4-D operation). However, since the operation of the four constituent transceivers are necessarily interrelated, certain blocks and signal lines in the exemplary embodiment of FIG. 2 perform four-dimensional operations and carry four-dimensional (4-D) signals, respectively. By 4-D, it is meant that the data from the four constituent transceivers are used simultaneously. In order to clarify signal relationships in FIG. 2, thin lines correspond to 1-dimensional functions or signals (i.e., relating to only a single constituent transceiver), and thick lines correspond to 4-D functions or signals (relating to all four constituent transceivers).

Referring to FIG. 2, the gigabit transceiver 200 includes a Gigabit Medium Independent Interface (GMII) block 202 subdivided into a receive GMII circuit 202R and a transmit GMII circuit 202T. The transceiver also includes a Physical Coding Sublayer (PCS) block 204, subdivided into a receive PCS circuit 204R and a transmit PCS circuit 204T, a pulse shaping filter 206, a digital-to analog (D/A) converter block 208, and a line interface block 210, all generally encompassing the transmitter portion of the transceiver.

The receiver portion generally includes a highpass filter 212, a programmable gain amplifier (PGA) 214, an analog-to-digital (A/D) converter 216, an automatic gain control (AGC) block 220, a timing recovery block 222, a pair-swap multiplexer block 224, a demodulator 226, an offset canceller 228, a near-end crosstalk (NEXT) canceller block 230 having three constituent NEXT cancellers and an echo canceller 232.

The gigabit transceiver 200 also includes an A/D first-in-first-out buffer (FIFO) 218 to facilitate proper transfer of data from the analog clock region to the receive clock region, and a loopback FIFO block (LPBK) 234 to facilitate proper transfer of data from the transmit clock region to the receive clock region. The gigabit transceiver 200 can optionally include an additional adaptive filter to cancel far-end crosstalk noise (FEXT canceller).

In operational terms, on the transmit path, the transmit section 202T of the GMII block receives data from the Media Access Control (MAC) module in byte-wide format at the rate of 125 MHz and passes them to the transmit section 204T of the PCS block via the FIFO 201. The FIFO 201 ensures proper data transfer from the MAC layer to the Physical Coding (PHY) layer, since the transmit clock of the PHY layer is not necessarily synchronized with the clock of the MAC layer. In one embodiment, this small FIFO 201 has from about three to about five memory cells to accommodate the file elasticity requirement which is a function of frame size and frequency offset.

The PCS transmit section 204T performs certain scrambling operations and, in particular, is responsible for encoding digital data into the requisite codeword representations appropriate for transmission. In, the illustrated embodiment of FIG. 2, the transmit PCS section 204T incorporates a coding engine and signal mapper that implements a trellis coding architecture, such as required by the IEEE 802.3ab specification for gigabit transmission.

In accordance with this encoding architecture, the PCS transmit section 204T generates four 1-D symbols, one for each of the four constituent transceivers. The 1-D symbol generated for the constituent transceiver depicted in FIG. 2 is filtered by the pulse shaping filter 206. This filtering assists in reducing the radiated emission of the output of the transceiver such that it falls within the parameters required by the Federal Communications Commission. The pulse shaping filter 206 is implemented so as to define a transfer function of $0.75+0.25\ z^{-1}$. This particular implementation is chosen so that the power spectrum of the output of the transceiver falls below the power spectrum of a 100Base-Tx signal. The 100Base-Tx is a widely used and accepted Fast Ethernet standard for 100 Mb/s operation on two pairs of Category-5 twisted pair cables. The output of the pulse shaping filter 206 is converted to an analog signal by the D/A converter 208 operating at 125 MHz. The analog signal passes through the line interface block 210, and is placed on the corresponding twisted pair cable.

On the receive path, the line interface block 210 receives an analog signal from the twisted pair cable. The received analog signal is preconditioned by the highpass filter 212 and the PGA 214 before being converted to a digital signal by the A/D converter 216 operating at a sampling rate of 125 MHz. The timing of the A/D converter 216 is controlled by the output of the timing recovery block 222. The resulting digital signal is properly transferred from the analog clock region to the receive clock region by the A/D FIFO 218. The output of the A/D FIFO 218 is also used by the AGC 220 to control the operation of the PGA 214.

The output of the A/D FIFO 218, along with the outputs from the A/D FIFOs of the other three constituent transceivers are inputted to the pair-swap multiplexer block 224. The pair-swap multiplexer block 224 uses the 4-D pair-swap control signal from the receive section 204R of PCS block to sort out the four input signals and send the correct signals to the respective feedforward equalizers 26 of the demodulator 226. This pair-swapping control is needed for the following reason. The trellis coding methodology used for the gigabit transceivers (101 and 102 of FIG. 1) is based on the fact that a signal on each twisted pair of wire corresponds to a respective 1-D constellation, and that the signals transmitted over four twisted pairs collectively form a 4-D constellation. Thus, for the decoding to work, each of the four twisted pairs must be uniquely identified with one of the four dimensions. Any undetected swapping of the four pairs would result in erroneous decoding. In an alternate embodiment of the gigabit transceiver, the pair-swapping control is performed by the demodulator 226, instead of the combination of the PCS receive section 204R and the pair-swap multiplexer block 224.

The demodulator 226 includes a feed-forward equalizer (FFE) 26 for each constituent transceiver, coupled to a deskew memory circuit 36 and a decoder circuit 38, implemented in the illustrated embodiment as a trellis decoder. The deskew memory circuit 36 and the trellis decoder 38 are common to all four constituent transceivers. The FFE 26 receives the received signal intended for it from the pair-swap multiplexer block 224. The FFE 26 is suitably implemented to include a precursor filter 28, a programmable inverse partial response (IPR) filter 30, a summing device 32, and an adaptive gain stage 34. The FFE 26 is a least-mean-squares (LMS) type adaptive filter which is configured to perform channel equalization as will be described in greater detail below.

The precursor filter 28 generates a precursor to the input signal 2. This precursor is used for timing recovery. The transfer function of the precursor filter 28 might be represented as $-\gamma+z^{-1}$, with $\gamma$ equal to $\frac{1}{16}$ for short cables (less than 80 meters) and $\frac{1}{8}$ for long cables (more than 80 m). The determination of the length of a cable is based on the gain of the coarse PGA 14 of the programmable gain block 214.

The programmable IPR filter 30 compensates the ISI (intersymbol interference) introduced by the partial response pulse shaping in the transmitter section of a remote transceiver which transmitted the analog equivalent of the digital signal 2. The transfer function of the IPR filter 30 may be expressed as $1/(1+Kz^{-1})$. In the present example, K has an exemplary value of 0.484375 during startup, and is slowly ramped down to zero after convergence of the decision feedback equalizer included inside the trellis decoder 38. The value of K may also be any positive value strictly less than 1.

The summing device 32 receives the output of the IPR filter 30 and subtracts therefrom adaptively derived cancellation signals received from the adaptive filter block, namely signals developed by the offset canceller 228, the NEXT cancellers 230, and the echo canceller 232. The offset canceller 228 is an adaptive filter which generates an estimate of signal offset introduced by component circuitry of the transceiver's analog front end, particularly offsets introduced by the PGA 214 and the A/D converter 216.

The three NEXT cancellers 230 may also be described as adaptive filters and are used, in the illustrated embodiment, for modeling the NEXT impairments in the received signal caused by interference generated by symbols sent by the three local transmitters of the other three constituent transceivers. These impairments are recognized as being caused by a crosstalk mechanism between neighboring pairs of cables, thus the term near-end crosstalk, or NEXT. Since each receiver has access to the data transmitted by the other three local transmitters, it is possible to approximately replicate the NEXT impairments through filtering. Referring to FIG. 2, the three NEXT cancellers 230 filter the signals sent by the PCS block to the other three local transmitters and produce three signals replicating the respective NEXT impairments. By subtracting these three signals from the output of the IPR filter 30, the NEXT impairments are approximately cancelled.

Due to the bidirectional nature of the channel, each local transmitter causes an echo impairment on the received signal of the local receiver with which it is paired to form a constituent transceiver. In order to remove this impairment, an echo canceller 232 is provided, which may also be characterized as an adaptive filter, and is used, in the illustrated embodiment, for modeling the signal impairment due to echo. The echo canceller 232 filters the signal sent by the PCS block to the local transmitter associated with the receiver, and produces an approximate replica of the echo impairment. By subtracting this replica signal from the output of the IPR filter 30, the echo impairment is approximately cancelled.

The adaptive gain stage 34 receives the processed signal from the summing circuit 32 and fine tunes the signal path gain using a zero-forcing LMS algorithm. Since this adaptive gain stage 34 trains on the basis of error signals generated by the adaptive filters 228, 230 and 232, it provides a more accurate signal gain than the one provided by the PGA 214 in the analog section.

The output of the adaptive gain stage 34, which is also the output of the FFE 26, is inputted to the deskew memory circuit 36. The deskew memory 36 is a four-dimensional function block, i.e., it also receives the outputs of the three FFEs of the other three constituent transceivers. There may be a relative skew in the outputs of the four FFEs, which are the four signal samples representing the four symbols to be decoded. This relative skew can be up to 50 nanoseconds, and is due to the variations in the way the copper wire pairs are twisted. In order to correctly decode the four symbols, the four signal samples must be properly aligned. The deskew memory aligns the four signal samples received from the four FFEs, then passes the deskewed four signal samples to a decoder circuit 38 for decoding.

In the context of the exemplary embodiment, the data received at the local transceiver was encoded before transmission, at the remote transceiver. In the present case, data might be encoded using an 8-state four-dimensional trellis code, and the decoder 38 might therefore be implemented as a trellis decoder. In the absence of intersymbol interference (ISI), a proper 8-state Viterbi decoder would provide optimal decoding of this code. However, in the case of Gigabit Ethernet, the Category-5 twisted pair cable introduces a significant amount of ISI. In addition, the partial response filter of the remote transmitter on the other end of the communication channel also contributes some ISI. Therefore, the trellis decoder 38 must decode both the trellis code and the ISI, at the high rate of 125 MHz. In the illustrated embodiment of the gigabit transceiver, the trellis decoder 38 includes an 8-state Viterbi decoder, and uses a decision-feedback sequence estimation approach to deal with the ISI components.

The 4-D output of the trellis decoder 38 is provided to the PCS receive section 204R. The receive section 204R of the PCS block de-scrambles and decodes the symbol stream, then passes the decoded packets and idle stream to the receive section 202T of the GMII block which passes them to the MAC module. The 4-D outputs, which are the error and tentative decision, respectively, are provided to the timing recovery block 222, whose output controls the sampling time of the A/D converter 216. One of the four components of the error and one of the four components of the tentative decision correspond to the receiver shown in FIG. 2, and are provided to the adaptive gain stage 34 of the FFE 26 to adjust the gain of the equalizer signal path. The error component portion of the decoder output signal is also provided, as a control signal, to adaptation circuitry incorporated in each of the adaptive filters 228, 229, 230, 231 and 232. Adaptation circuitry is used for the updating and training process of filter coefficients.

Figure 3A:
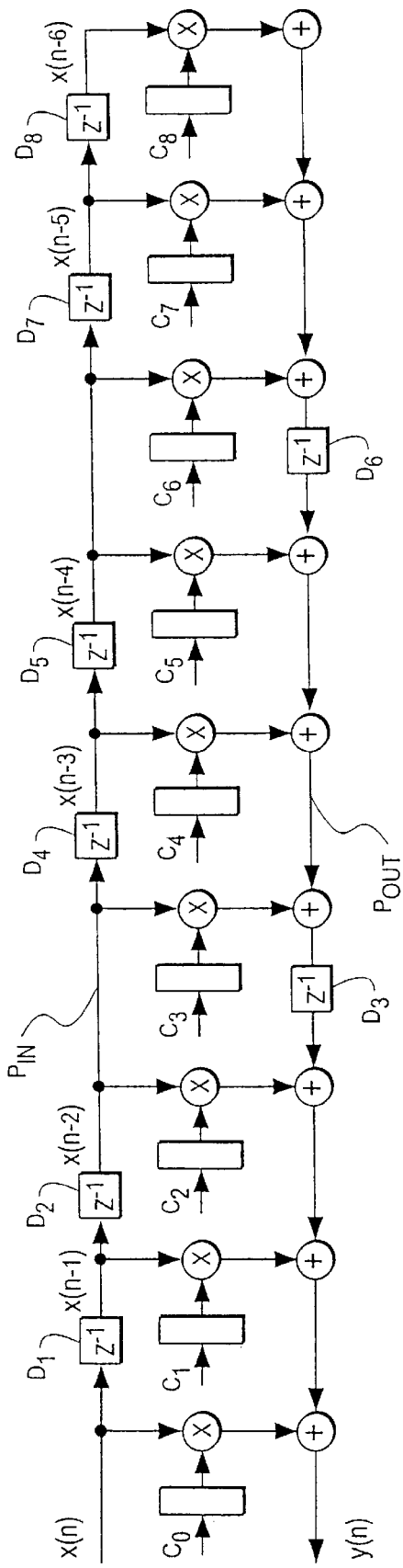
FIG. 3A is a simplified structure diagram of an adaptive FIR filter as might be implemented as an echo/NEXT canceller circuit in one embodiment of the gigabit transceiver.

The adaptive filters used to implement the echo canceller 232 and the NEXT cancellers 230 are typically finite impulse response (FIR) filters. FIG. 3A shows a structure of an adaptive FIR filter used as an echo/NEXT canceller in one embodiment of the gigabit transceiver.

Referring to FIG. 3A, the adaptive FIR filter includes an input signal path $P_{in}$, an output signal path $P_{out}$, and N taps (N is 9 in FIG. 3A). Each tap connects a point on the input signal path $P_{in}$ to a point on the output signal path $P_{out}$. Each tap, except for the last tap, includes a coefficient $C_i$, a multiplier $M_i$ and an adder $A_i$, i=0, . . . ,N−2. The last tap includes the coefficient $C_{N-1}$, the multiplier $M_{N-1}$, and no adder. The coefficients $C_i$, where i=0, . . . ,N−1, are stored in coefficient registers. During each adaptation process, the values of the coefficients $C_i$ are trained using a well-known least-mean-squares algorithm by an adaptation circuitry (not shown in FIG. 3A). After training, the coefficients $C_i$ converge to stable values. The FIR filter includes a set of delay elements $D_i$, where each delay element is implemented in the CMOS dynamic register 300 in FIG. 3A. The number of delay elements $D_i$ determines the order of the FIR filter. The output y(n), i.e., the filter output at time instant n, is a function of the input at time instant n and of the past inputs at time instants n−1 through n−(N−1), and is expressed as:

$$y(n) = \sum_{i=0}^{N-1} C_i x(n-i) \quad (1)$$

where x(n−i) denotes the input at time instant n−i, and N denotes the number of taps. The output y(n), as shown in Equation (1), is a weighted sum of the input data x(n−i), with i=0, . . . ,N−1. The coefficients $C_i$ act as the weighting factors on the input data. If a coefficient $C_i$ has a very small absolute value, relative to the values of other coefficients, then the contribution of the corresponding input data x(n−i) to the value of y(n) is relatively insignificant.

Figure 3B:
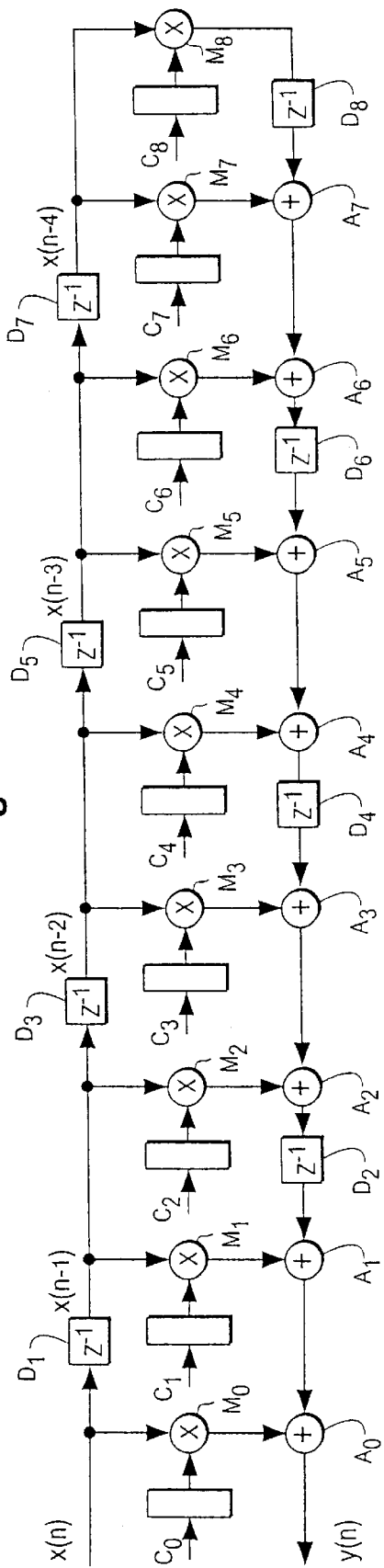
FIG. 3B is an equivalent structure of the adaptive FIR filter shown in FIG. 3A.

FIG. 3B is an equivalent structure of the filter shown in FIG. 3A. The two structures in FIGS. 3A and 3B provide the same filter transfer function, but differ in certain performance characteristics. The difference is due to the placement of the delay elements $D_i$, i=1, . . . ,N−1 (N=9 in FIGS. 3A, 3B). If all the delay elements are placed in the input path $P_{in}$, as in the well-known direct form of the FIR filter, then the registers that are used to implement the delay elements are small, need only to be of the same size as the input data x(n). If all the delay elements are placed on the output path $P_{out}$, as in the well-known transposed form of the FIR filter, then the registers used as the delay elements must have more bits in order to hold the largest possible sum of products $C_i^* x(n-i)$. Large registers cost more and consume more power than small registers. Thus, the advantage of placing the delay elements on the input path instead of the output path is that fewer register bits are required. However, the larger the number of the delay elements on the input path, the lower the operating speed of the filter is.

If the propagation delay from the input of the filter to the last tap exceeds the required clock period, then the filter is not usable. To break the long propagation delay, that would occur if all the delay elements were placed on the input path $P_{in}$, into small delay intervals, some of the delay elements are placed on the output path $P_{out}$ at regular intervals, as shown in the filter structures in FIGS. 3A and 3B. The structure in FIG. 3B, which has a "two-to-one" split of delay elements between the input path and the output path, can operate at a higher clock speed than the structure in FIG. 5A, which has a "three-to-one" split. Computational results show that both of these structures are acceptable for use in a high-speed system such as the gigabit transceiver. The taps of the adaptive FIR filters used in the gigabit transceiver can be switched from an active state to an inactive state.

Each of the delay elements $D_i$ is implemented by a stack of individual CMOS dynamic registers, each of the individual CMOS dynamic registers handling one bit of data. The present invention provides a structure for each of the dynamic registers such that the dynamic registers pose no problem to IDDQ testing of the gigabit transceiver chip.

Figure 4:
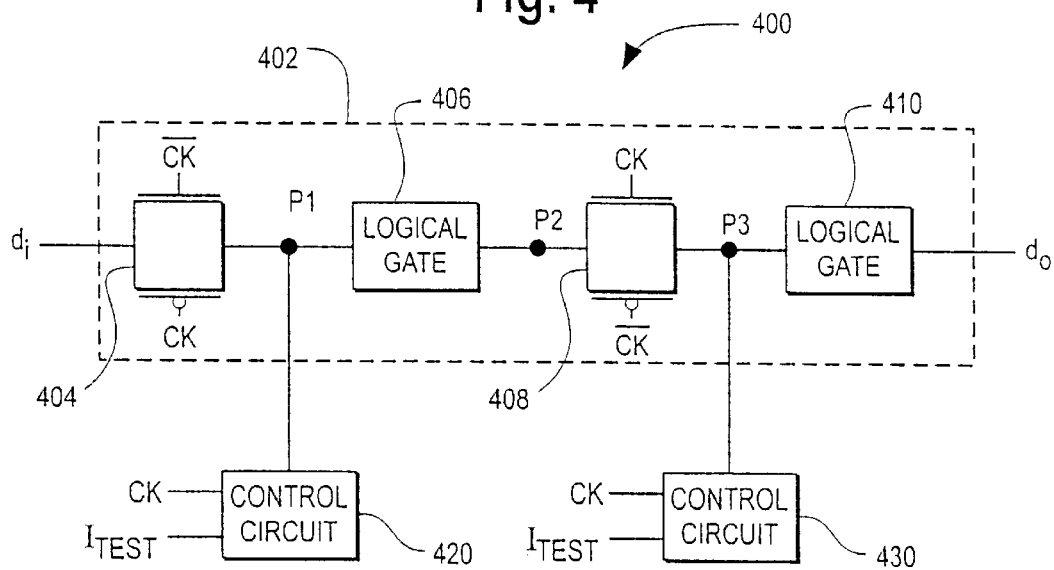
FIG. 4 is a generalized block diagram of the present invention.

FIG. 4 is a block diagram of a system constructed in accordance with the present invention. The system 400 includes a circuit 402 and control circuits 420 and 430. The circuit 402 includes transmission gates 404 and 408 which operate in accordance with a clock signal $\overline{ck}$ and its inverse $\overline{ck}$, and logical gates 406 and 410. Each of the nodes P1 and P3 in the circuit 402, if not controlled, may have an unknown floating voltage during a steady state, also called a quiescent portion, of the clock signal. A floating voltage at node P1 would cause the transmission gate 404 to draw a substantial amount of power supply current during a steady state of the clock signal. Control circuit 420 is coupled to the node P1 to prevent the node P1 from having an unknown floating voltage during a steady state of the clock signal ck. A floating voltage at node P3 would cause the transmission gate 408 to draw a substantial amount of power supply current during a steady state of the clock signal. Control circuit 430 is coupled to the node P3 to prevent the node P3 from having an unknown floating voltage during a steady state of the clock signal ck.

Figure 5:
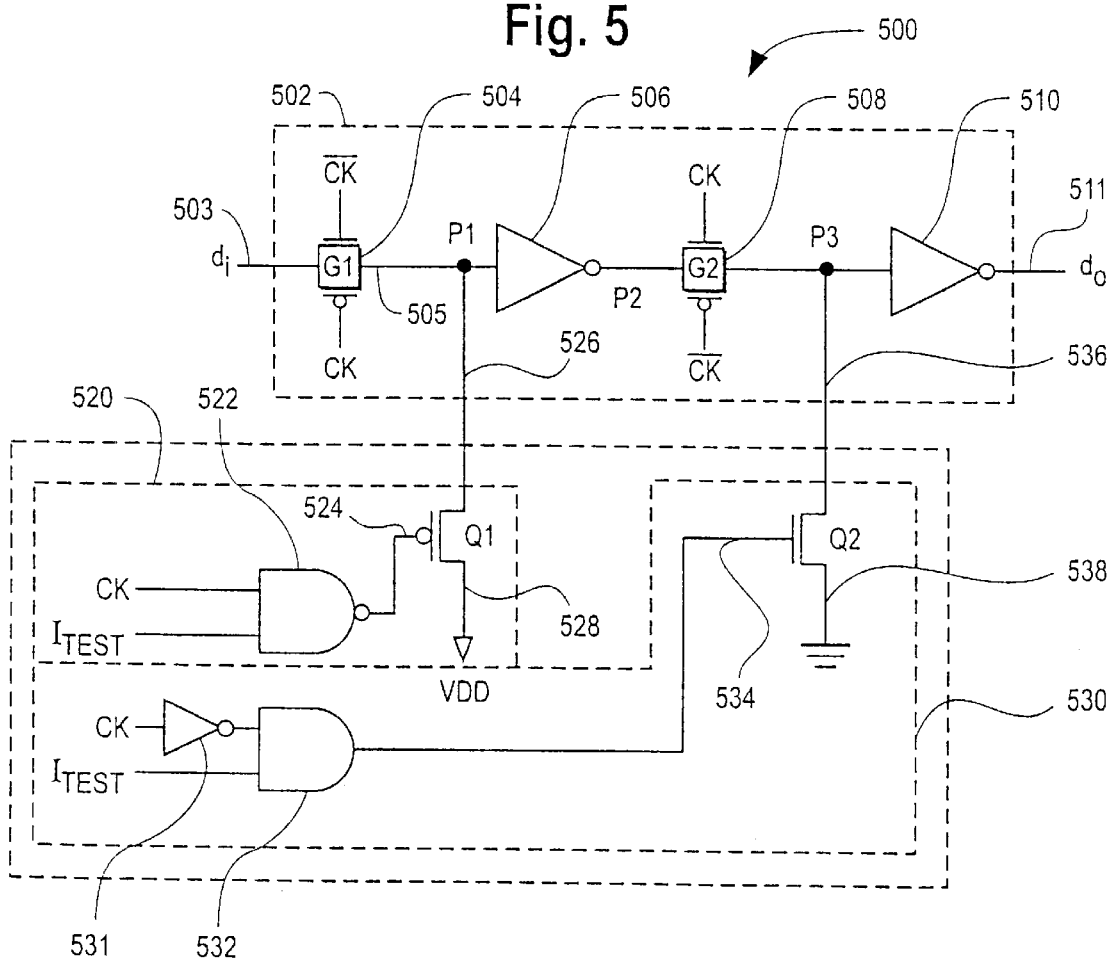
FIG. 5 is a schematic diagram of a rising edge CMOS dynamic register with IDDQ testing capability, constructed in accordance with the present invention.

FIG. 5 is a schematic diagram of a system constructed in accordance with the present invention. The system 500 represents a rising edge dynamic register with IDDQ testing capability. The system 500 includes a rising edge dynamic register 502 and a control circuit 520.

The structure of the dynamic register 402 is the traditional structure of a rising edge dynamic register. The dynamic register 502 is called a rising edge dynamic register because at each rising edge of the clock signal, input data gets "pushed" through the register. In other words, data that are present at the input 503 of the register 502 when the clock signal ck is low appears at the output 511 of the register 502 at the rising edge of the clock signal as the clock signal ck transits from low to high.

The dynamic register 502 includes a first transmission gate 504, an inverter 506, a second transmission gate 508, and an inverter 510 connected in series. The rising edge dynamic register 502 receives an incoming data $d_i$ when the clock signal is low. When the clock signal ck is low, i.e., when $\overline{ck}$ is high, the transmission gate 504 enables a path between its input 503 and its output 505, hence, between its input 503 and the node P1. Thus, when the transmission gate 504 is open, the input signal $d_i$ drives the node P1. The voltage at node P1 is therefore approximately equal to the value of $d_i$.

When the clock signal ck is high, the transmission gate 504 disables the path between its input 503 and its output 505, thus blocking the incoming signal $d_i$ from passing through. The node P1 is then not driven by any input signal $d_i$. Node P1 may float to an unknown voltage level V1. Floating voltage may exist when a circuit node is not driven by voltage at another node, or not tied down to a fixed known voltage. Floating voltage may be caused by leftover charge at the node from a previous flow of charge at that node. A floating voltage is undesirable since it may cause current to be drawn by a nearby transistor from the power supply. The floating voltage can be somewhere in the middle of a logical 1 voltage and a logical 0 voltage, and this may cause the transmission gate 504 to start drawing current from the power supply. This current is substantially higher than the quiescent current.

During an IDDQ test, it is not possible to determine whether a large power current dissipated in the circuit was caused by a defect in the circuit or just by floating nodes. Thus, IDDQ testing would be unreliable if there are floating nodes in the circuit under test.

The control circuit 520 prevents the node P1 from having a floating voltage, when the transmission gate 504 closes its transmission path while the clock signal ck is high, by pulling the node P1 to a known external voltage. The following is a detailed description of the control circuit 520.

The control circuit 520 includes a NAND gate 522 and a p-MOS transistor Q1. The inputs to the NAND gate 522 are the clock signal ck and a test signal $I_{test}$. The test signal $I_{test}$ indicates whether the circuit is undergoing an IDDQ test. When the test signal $I_{test}$ is high (logical 1), then this indicates that the circuit is being tested and that the clock signal ck is being stopped at one of the quiescent portion, also called steady state, of its cycle. The output of the NAND gate 522 is coupled to the gate terminal 524 of the p-MOS transistor Q1. The drain terminal 526 of transistor Q1 is coupled to the node P1. The source terminal 528 of transistor Q1 is connected to a non-zero voltage source $V_{DD}$.

When the clock signal ck is high (logical 1), the transmission gate 504 is closed, and the node P1 may have a floating voltage. Since it is desirable to prevent floating voltage only during a circuit test, and not during normal operation of the circuit, the test signal $I_{test}$ is used to indicate whether the circuit is being tested. When the test signal $I_{test}$ is high, indicating the circuit is being tested, and the clock signal ck is also high, the output of the NAND gate 522 is low (logical 0). This low output voltage is applied to the gate terminal 524 of transistor Q1, causing Q1 to turned on. This, in turn, pulls the voltage at node P1 to $V_{DD}$ via the conducting path between the drain terminal 526 and the source terminal 528 of transistor Q1.

The situation where the transistor Q1 pulls the node P1 to $V_{DD}$ while the transmission gate 504 is open and the node P1 is being driven with the input signal $d_i$ must be avoided since it would create a conflict of voltage at node P1. The output of the NAND gate 522 ensures that this situation does not happen. When the transmission gate 504 enables its transmission path to drive the node P1 with the incoming signal $d_i$, that is, when the clock signal ck is low (logical 0), the output of the NAND gate 522 is a logical 1 voltage, regardless of the value of the test signal $I_{test}$. Since a logical 1 voltage is applied to the gate terminal 524 of transistor Q1, the transistor Q1 is turned off and the control circuit 520 does not affect the voltage at node P1.

In summary, when the transmission gate 504 is open, the transistor Q1 is off and the control circuit 520 exerts no influence at node P1, whether the circuit is under IDDQ test or in normal operation. When the transmission gate 504 is closed and the circuit is undergoing an IDDQ test, the transistor Q1 is on and the control circuit 520 pulls the voltage at node P1 to $V_{DD}$ via the conducting path between the drain terminal 526 and the source terminal 528 of transistor Q1. The control circuit 520 does not interact with the circuit 502 while the circuit 502 is in normal operation, since $I_{test}$ would be a logical 0 voltage, causing the output of the NAND gate 522 to be a logical 1, which in turn causes the p-MOS transistor Q1 to be off.

The transmission gates 504 and 508 operate on clock signals which are complementary, i.e., inverses of each other, thus only one gate is open at a time. When the clock signal ck is low, the transmission gate 504 receives an input signal $d_i$, lets it pass through node P1 and inverter 506. The voltage at node P2 is equal to the inverse of the value of $d_i$. While the transmission gate 504 is open, the transmission gate 508 closes its transmission path, preventing the signal at node P2 from passing through. While the transmission gate 508 is closed, without the control circuit 530 to control the voltage at the node P3, the node P3 may have an unknown floating voltage because the node P3 is not driven by the known signal at the node P2.

The control circuit 530 prevents the node P3 from having a floating voltage, when the transmission gate 508 closes its transmission path while the clock signal ck is low, by pulling the node P3 to a known external voltage. The following is a detailed description of the control circuit 530.

The control circuit 530 includes an inverter 531, an AND gate 532 and a n-MOS transistor Q2. The inverter 531 transforms the clock signal ck to its inverse $\overline{ck}$. The input signals to the AND gate 532 are the inverse clock signal $\overline{ck}$ and a test signal $I_{test}$. The test signal $I_{test}$ indicates whether the circuit is undergoing an IDDQ test. When the test signal $I_{test}$ is high (logical 1), this indicates that the circuit is being tested and that the clock signal ck is being stopped at one of the quiescent portion, also called steady state, of its cycle. The output of the AND gate 532 is coupled to the gate terminal 534 of the n-MOS transistor Q2. The drain terminal 536 of transistor Q2 is coupled to the node P3. The source terminal 538 of transistor Q2 is connected to ground.

When the clock signal ck is low (logical 0), the transmission gate 508 is closed, and the node P3 may have a floating voltage. Since it is desirable to prevent floating voltage only during a circuit test, and not during normal operation of the circuit, the test signal $I_{test}$ is used to indicate whether the circuit is being tested. When the test signal $I_{test}$ is high, indicating the circuit is being tested, and the clock signal ck is low (i.e., $\overline{ck}$ is high), the output of the AND gate 532 is high (logical 1). This high voltage is applied to the gate terminal 534 of n-MOS transistor Q2, causing Q2 to turned on. This, in turn, pulls the voltage at node P3 to ground via the conducting path between the drain terminal 526 and the source terminal 528 of transistor Q2.

The situation where the transistor Q2 pulls the node P3 to ground while the transmission gate 508 is open and the node P3 is being driven with the input signal $d_i$ must be avoided since it would create a conflict of voltage at node P3. The output of the AND gate 532 ensures that this situation does not happen. When the transmission gate 508 enables its transmission path to drive the node P1 with the incoming signal $d_i$, that is, when the clock signal ck is high (i.e., $\overline{ck}$ is low), the output of the AND gate 532 is a logical 0 voltage, regardless of the value of the test signal $I_{test}$. Since a logical 0 voltage is applied to the gate terminal 524 of n-MOS transistor Q2, the n-MOS transistor Q2 is turned off and the control circuit 530 does not affect the voltage at node P3.

In summary, when the transmission gate 508 is open, the transistor Q2 is off and the control circuit 530 exerts no influence at node P3, whether the circuit is under IDDQ test or in normal operation. When the transmission gate 508 is closed and the circuit is undergoing an IDDQ test, the transistor Q2 is on and the control circuit 530 pulls the voltage at node P3 to ground via the conducting path between the drain terminal 536 and the source terminal 538 of n-MOS transistor Q2. The control circuit 530 does not interact with the circuit 502 while the circuit 502 is in normal operation, since $I_{test}$ would be a logical 0 voltage, causing the output of the AND gate 532 to be a logical 0, which in turn causes the n-MOS transistor Q2 to be off.

It is not necessary to have node P1 pulled to $V_{DD}$ and node P2 pulled to ground. Each of the nodes can be pulled to either voltages. In other words, transistor Q1 does not have to be of p-MOS type and transistor Q2 does not have to be of n-MOS type. They can be of either type.

However, from the point of view of layout of an integrated circuit chip, when there are more of one type of transistors than the other, the layout will not be as compact as when there is the same number of n-MOS and p-MOS transistors. This is due the fact that, on an integrated chip, the two types of transistors are laid out as two parallel rows, each row has only one type of transistors. Thus, if one row has less transistors than the other, there will be a waste of silicon real estate. Thus, in one embodiment of the gigabit transceiver chip, instead of using two p-MOS or two n-MOS transistors for both transistors Q1 and Q2, one p-MOS and one n-MOS transistors are used to provide a more compact layout design.

In an exemplary embodiment of the invention, the logic gates 522, 531, and 532 form a global logic circuit which is shared by all of the dynamic registers in a given integrated circuit chip. Therefore, compared to a traditional dynamic register which does not have the IDDQ testing capability, the dynamic register of the present invention only requires two extra transistors Q1 and Q2.

The number of these extra transistors can be further reduced by placing a restriction on the setting of the clock signal ck during IDDQ testing. If the IDDQ test is always performed with the clock signal set low, the node P1 will always be driven with the input data $d_i$ through the first transmission gate 504. Accordingly, the node P1 will never be a floating node, thus there will no need to use the p-MOS transistor Q1. Thus, if the IDDQ test is always performed with the clock signal ck set low, the p-MOS transistor Q1 can be eliminated. Conversely, if the IDDQ test is always performed with the clock signal ck set high, then the node P3 will always be driven by the node P2 through the second transmission gate 508. The node P3 will never be a floating node, thus, there will be no need to use the n-MOS transistor Q2. Thus, if the IDDQ test is always performed with the clock signal ck set high, the n-MOS transistor Q2 can be eliminated. Therefore, by placing a restriction on the setting of the clock signal ck while the IDDQ test is being performed, the present invention only requires one extra transistor per dynamic register, as compared to a traditional dynamic register.

Figure 6:
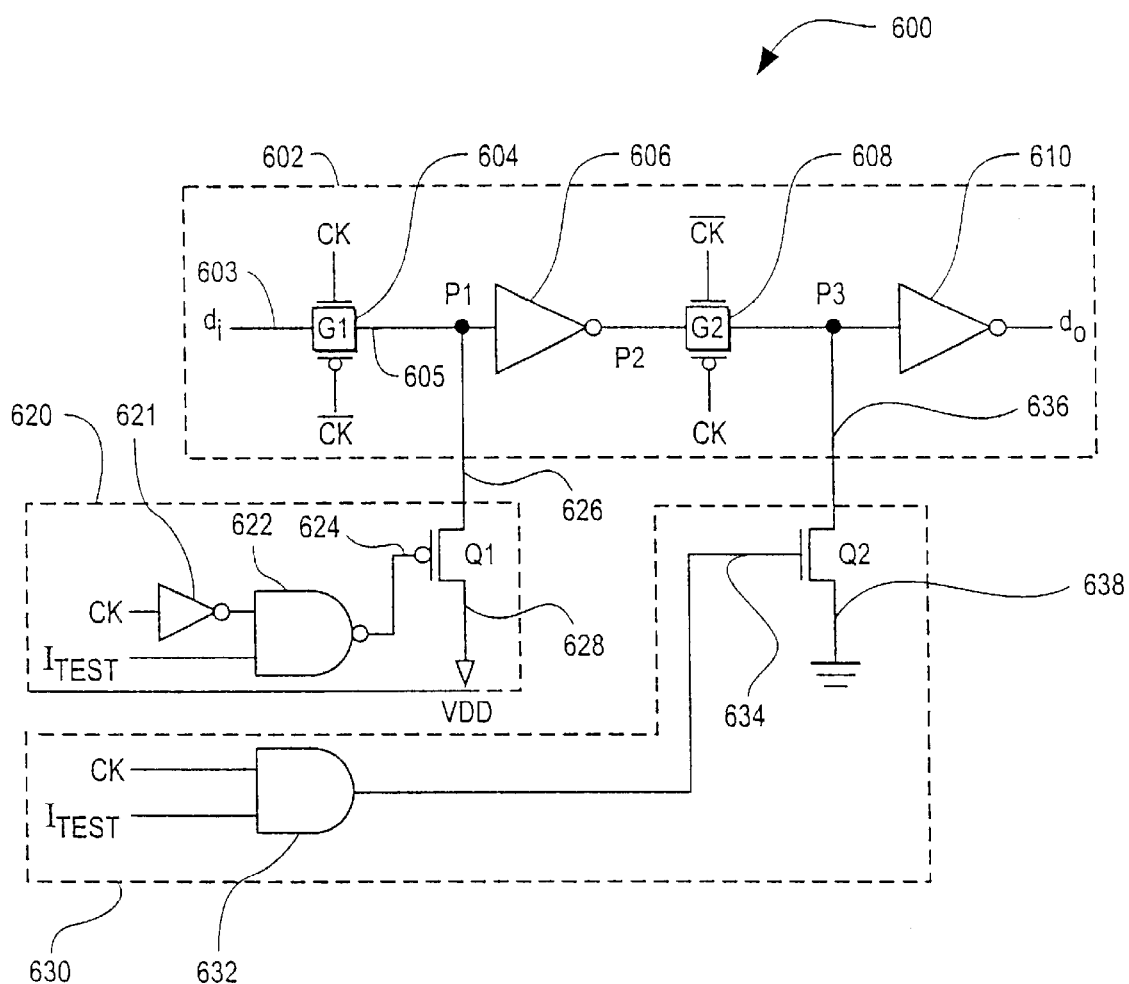
FIG. 6 is a schematic diagram of a falling edge CMOS dynamic register with IDDQ testing capability, constructed in accordance with the present invention.

FIG. 6 is a schematic diagram of another system constructed in accordance with the present invention. The system 600 is a falling edge dynamic register with IDDQ testing capability. The system 600 includes a falling edge dynamic register 602 and a control circuit 612. The dynamic register 602 is called a falling edge dynamic register because at each falling edge of the clock signal ck, input data gets "pushed" through the register. In other words, data which are present at the input of the register 602 when the clock signal is high, appears at the output of the register 602 at the falling edge of the clock signal as the clock signal transits from high to low.

Referring to FIG. 6, the register 602 includes a first transmission gate 604, a first inverter 606, a second transmission gate 608, and a second inverter 610 connected in series. The falling edge dynamic register 602 receives an incoming data $d_i$ when the clock signal ck is high. When the clock signal ck is high, i.e., when $\overline{ck}$ is low, the transmission gate 604 enables a path between its input 603 and its output 605, hence, between its input 603 and the node P1. Thus, when the transmission gate 604 is open, the input signal $d_i$ drives the node P1. The voltage at node P1 is therefore approximately equal to the value of $d_i$.

When the clock signal ck is low, the transmission gate 604 disables the path between its input 603 and its output 605, thus blocking the incoming signal $d_i$ from passing through. The node P1 is then not driven by any input signal $d_i$. Node P1 may have an unknown floating voltage. This floating voltage can be somewhere in the middle of a logical 1 voltage and a logical 0 voltage, and this may cause the transmission gate 504 to start drawing current from the power supply.

Referring to FIG. 6, the control circuit 620 prevents the node P1 from having a floating voltage, when the transmission gate 604 closes its transmission path while the clock signal ck is high, by pulling the node P1 to a known external voltage. The following is a detailed description of the control circuit 620.

The control circuit 620 includes an inverter 621, a NAND gate 622 and a p-MOS transistor Q1. The inverter 621 transforms the clock signal ck to its inverse $\overline{ck}$. The input signals to the NAND gate 622 are the inverse clock signal $\overline{ck}$ and a test signal $I_{test}$. The test signal $I_{test}$ indicates whether the circuit is undergoing an IDDQ test. When the test signal $I_{test}$ is high (logical 1), this indicates that the circuit is being tested and that the clock signal ck is being stopped at one of the quiescent portion, also called steady state, of its cycle.

The output of the NAND gate 622 is coupled to the gate terminal 624 of the p-MOS transistor Q1. The drain terminal 626 of transistor Q1 is coupled to the node P1. The source terminal 628 of transistor Q1 is connected to a non-zero voltage source $V_{DD}$.

When the clock signal ck is low (logical 0), the transmission gate 604 is closed, and the node P1 may have a floating voltage. Since it is desirable to prevent floating voltage only during a circuit test, and not during normal operation of the circuit, the test signal $I_{test}$ is used to indicate whether the circuit is being tested. When the test signal $I_{test}$ is high, indicating the circuit is being tested, and the clock signal ck is low, the output of the NAND gate 622 is low (logical 0). This low output voltage is applied to the gate terminal 624 of transistor Q1, causing Q1 to turned on. This, in turn, pulls the voltage at node P1 to $V_{DD}$ via the conducting path between the drain terminal 626 and the source terminal 628 of transistor Q1.

The situation where the transistor Q1 pulls the node P1 to $V_{DD}$ while the transmission gate 604 is open and the node P1 is being driven with the input signal $d_i$ must be avoided since it would create a conflict of voltage at node P1. The output of the NAND gate 622 ensures that this situation does not happen. When the transmission gate 604 enables its transmission path to drive the node P1 with the incoming signal $d_i$, that is, when the clock signal ck is high (logical 1), the output of the NAND gate 622 is a logical 1 voltage, regardless of the value of the test signal $I_{test}$. Since a logical 1 voltage is applied to the gate terminal 624 of transistor Q1, the transistor Q1 is turned off and the control circuit 620 does not affect the voltage at node P1.

In summary, when the transmission gate 604 is open, the transistor Q1 is off and the control circuit 620 exerts no influence at node P1, whether the circuit is under IDDQ test or in normal operation. When the transmission gate 604 is closed and the circuit is undergoing an IDDQ test, the transistor Q1 is on and the control circuit 620 pulls the voltage at node P1 to $V_{DD}$ via the conducting path between the drain terminal 626 and the source terminal 628 of transistor Q1. The control circuit 620 does not interact with the circuit 602 while the circuit 602 is in normal operation, since $I_{test}$ would be a logical 0 voltage, causing the output of the NAND gate 622 to be a logical 1, which in turn causes the p-MOS transistor Q1 to be off.

Referring to FIG. 6, the transmission gates 604 and 608 operate on clock signals which are inverses of each other, thus only one gate would be open at a time. When the clock signal ck is high, the transmission gate 604 receives an input signal $d_i$, lets it pass through node P1 and inverter 606. The voltage at node P2 is equal to the inverse of the value of $d_i$. While the transmission gate 604 is open, the transmission gate 608 closes its transmission path, preventing the signal at node P2 from passing through. While the transmission gate 608 is closed, without the control circuit 630 to control the voltage at the node P3, the node P3 may have an unknown floating voltage because the node P3 is not driven by the known signal at the node P2.

Referring to FIG. 6, the control circuit 630 prevents the node P3 from having a floating voltage, when the transmission gate 608 closes its transmission path while the clock signal ck is high, by pulling the node P3 to a known external voltage. The following is a detailed description of the control circuit 630.

The control circuit 630 includes an AND gate 632 and a n-MOS transistor Q2. The input signals to the AND gate 632 are the clock signal ck and a test signal $I_{test}$. The test signal $I_{test}$ indicates whether the circuit is undergoing an IDDQ test. When the test signal $I_{test}$ is high (logical 1), this indicates that the circuit is being tested and that the clock signal ck is being stopped at one of the quiescent portion (either low or high), also called steady state, of its cycle. The output of the AND gate 632 is coupled to the gate terminal 634 of the n-MOS transistor Q2. The drain terminal 636 of transistor Q2 is coupled to the node P3. The source terminal 638 of transistor Q2 is connected to ground.

When the clock signal ck is high (logical 1), the transmission gate 608 is closed, and the node P3 may have a floating voltage. Since it is desirable to prevent floating voltage only during a circuit test, and not during normal operation of the circuit, the test signal $I_{test}$ is used to indicate whether the circuit is being tested. When the test signal $I_{test}$ is high, indicating the circuit is being tested, and the clock signal ck is high, the output of the AND gate 632 is high (logical 1). This high voltage is applied to the gate terminal 634 of n-MOS transistor Q2, causing Q2 to turned on. This, in turn, pulls the voltage at node P3 to ground via the conducting path between the drain terminal 626 and the source terminal 628 of n-MOS transistor Q2.

The situation where the transistor Q2 pulls the node P3 to ground while the transmission gate 608 is open and the node P3 is being driven with the input signal $d_i$ must be avoided since it would create a conflict of voltage at node P3. The output of the AND gate 632 ensures that this situation does not happen. When the transmission gate 608 enables its transmission path to drive the node P1 with the incoming signal $d_i$, that is, when the clock signal ck is low, the output of the AND gate 632 is a logical 0 voltage, regardless of the value of the test signal $I_{test}$. Since a logical 0 voltage is applied to the gate terminal 624 of n-MOS transistor Q2, the n-MOS transistor Q2 is turned off and the control circuit 630 does not affect the voltage at node P3.

In summary, when the transmission gate 608 is open, the transistor Q2 is off and the control circuit 630 exerts no influence at node P3, whether the circuit is under IDDQ test or in normal operation. When the transmission gate 508 is closed and the circuit is undergoing an IDDQ test, the transistor Q2 is on and the control circuit 630 pulls the voltage at node P3 to ground via the conducting path between the drain terminal 636 and the source terminal 638 of the n-MOS transistor Q2. The control circuit 630 does not interact with the circuit 602 while the circuit 602 is in normal operation, since $I_{test}$ would be a logical 0 voltage, causing the output of the AND gate 632 to be a logical 0, which in turn causes the n-MOS transistor Q2 to be off.

It is not necessary to have node P1 pulled to $V_{DD}$ and node P2 pulled to ground. Each of the nodes can be pulled to either voltages. In other words, transistor Q1 does not have to be of p-MOS type and transistor Q2 does not have to be of n-MOS types They can be of either type. It is noted that, for a p-MOS transistor, the source terminal must be connected to a positive voltage source $V_{DD}$, and that, for an n-MOS transistor, the source terminal must be connected to ground.

Although Q1 and Q2 can be of either type of MOS transistors, as pointed out above in the discussion of the rising edge dynamic register of FIG. 5, from the point of view of layout of an integrated circuit chip, when there are more of one type of transistors than the other, the layout will not be as compact as when the there is the same number of n-MOS and p-MOS transistors. Thus, in one embodiment of the gigabit transceiver chip, instead of using two p-MOS or two n-MOS transistors for both transistors Q1 and Q2, one p-MOS and one n-MOS transistors are used to provide a more compact layout design.

In an exemplary embodiment of the invention, the logic gates 621, 622, and 632 form a global logic circuit which is shared by all of the dynamic registers in a given integrated circuit chip. Therefore, compared to a traditional dynamic register which does not have the IDDQ testing capability, the dynamic register of the present invention only requires two extra transistors Q1 and Q2.

The number of these extra transistors can be further reduced by placing a restriction on the setting of the clock signal ck during IDDQ testing. If the IDDQ test is always performed with the clock signal set high, the node P1 will always be driven with the input data $d_i$ through the first transmission gate 504. Accordingly, the node P1 will never be a floating node, thus there will no need to use the p-MOS transistor Q1. Thus, if the IDDQ test is always performed with the clock signal ck set high, the p-MOS transistor Q1 can be eliminated. Conversely, if the IDDQ test is always performed with the clock signal ck set low, then the node P3 will always be driven by the node P2 through the second transmission gate 508. The node P3 will never be a floating node, thus, there will be no need to use the n-MOS transistor Q2. Thus, if the IDDQ test is always performed with the clock signal ck set low, the n-MOS transistor Q2 can be eliminated. Therefore, by placing a restriction on the setting of the clock signal ck while the IDDQ test is being performed, the present invention only requires one extra transistor per dynamic register, as compared to a traditional dynamic register.

While certain exemplary embodiments have been described in detail and shown in the accompanying drawings, it is to be understood that such embodiments are merely illustrative of and not restrictive on the broad invention, and that this invention is not to be limited to the specific arrangements and constructions shown and described, since various other modifications may occur to those with ordinary skill in the art.

What is claimed is:

1. A method for controlling a voltage at a node in a circuit including a transmission gate that has an input terminal and an output terminal, the node being coupled to the output terminal of the transmission gate, the method comprising the operations of:
   (a) determining whether the transmission gate is open or closed;
   (b) determining whether the circuit is under test; and
   (c) if the transmission gate is closed and the circuit is under test, pulling the node to a fixed voltage.

2. The method of claim 1 further comprising the operation of:
   (d) if the transmission gate is open, driving the node with an input signal.

3. The method of claim 1 wherein determining operation (b) comprises determining whether the circuit is under test based upon a value of a circuit test signal.

4. The method of claim 3 wherein the circuit is determined to be under test when the circuit test signal is of a predetermined value.

5. The method of claim 1 wherein a substantial amount of power supply current is prevented from dissipating in the circuit.

6. The method of claim 4 wherein the operations are facilitated by a control circuit, the control circuit including a logic gate and a transistor, the logic gate having an output and being responsive to the circuit test signal, the transistor having a gate terminal coupled to the output of the logic gate, the control circuit being coupled to the node via the transistor.

7. The method of claim 6 wherein the circuit test signal indicates whether the circuit is undergoing an IDDQ test.

8. The method of claim 6 wherein the logic gate is a NAND gate.

9. The method of claim 6 wherein the logic gate is an AND gate.

10. The method of claim 1 wherein the circuit includes an inverter disposed in series with the transmission gate, the node being located between the transmission gate and the inverter.

11. The method of claim 1 wherein the transmission gate is of CMOS type.

12. The method of claim 7 further comprising the operation of:
    (d) if the transmission gate is open, driving the node with an input signal.

13. The method of claim 12 wherein driving operation (d) comprises turning off the transistor in the control circuit at substantially the same time as the transmission gate is opened, so that the control circuit does not affect the voltage at the node.

14. The method of claim 7 wherein pulling operation (c) comprises turning on the transistor in the control circuit at substantially the same time as the transmission gate is closed, so as to pull the voltage of the node to a fixed voltage via the transistor.

15. The method of claim 6 wherein the circuit is a dynamic register.

16. The method of claim 15 wherein the dynamic register is included in a gigabit transceiver chip.

17. A system for controlling a voltage at a node in a circuit including a transmission gate that has an input terminal and an output terminal, the node being connected to the output terminal of the transmission gate, the system comprising:
    a control circuit coupled to the circuit at the node, the control circuit being adapted to pull the node to a fixed voltage if the transmission gate is closed and the circuit is under test.

18. The system of claim 17 further comprising:
an input signal adapted to drive the node if the transmission gate is open.

19. The system of claim 17 further comprising:
means for determining whether the circuit is under test.

20. The system of claim 19 wherein the means for determining whether the circuit is under test comprises a circuit test signal, wherein the circuit is determined to be under test when the circuit test signal is of a predetermined value.

21. The system of claim 17 wherein a substantial amount of power supply current is prevented from dissipating in the circuit.

22. The system of claim 20 wherein the control circuit includes a logic gate and a transistor, the logic gate having an output and being responsive to the circuit test signal, the transistor having a gate terminal coupled to the output of the logic gate, the control circuit being coupled to the node via the transistor.

23. The system of claim 22 wherein the circuit test signal indicates whether the circuit is undergoing an IDDQ test.

24. The system of claim 22 wherein the logic gate is a NAND gate.

25. The system of claim 22 wherein the logic gate is an AND gate.

26. The system of claim 17 wherein the circuit includes an inverter disposed in series with the transmission gate, the node being located between the transmission gate and the inverter.

27. The system of claim 17 wherein the transmission gate is of CMOS type.

28. The system of claim 23 further comprising: an input signal adapted to chive the node if the transmission gate is open.

29. The system of claim 28 wherein the control circuit turns off the transistor in the control circuit at substantially the same time as the transmission gate is opened, so that the control circuit does not affect the voltage at the node.

30. The system of claim 23 wherein the control circuit turns on the transistor in the control circuit at substantially the same time as the transmission gate is closed, so as to pull the voltage of the node to a fixed voltage via the transistor.

31. The system of claim 22 wherein the circuit is a dynamic register.

32. The system of claim 31 wherein the dynamic register is included in a gigabit transceiver chip.

* * * * *